(12) United States Patent
Beach

(10) Patent No.: US 7,897,998 B2
(45) Date of Patent: Mar. 1, 2011

(54) III-NITRIDE POWER SEMICONDUCTOR DEVICE

(75) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 307 days.

(21) Appl. No.: 11/899,510

(22) Filed: Sep. 6, 2007

(65) Prior Publication Data

US 2009/0065785 A1   Mar. 12, 2009

(51) Int. Cl.
*H01L 29/74* (2006.01)
(52) U.S. Cl. ............... 257/168; 257/129; 257/493; 257/E29.222; 438/140
(58) Field of Classification Search .......... 257/168, 257/129, 493, E29.222, 1, 108; 438/140
See application file for complete search history.

(56) References Cited

U.S. PATENT DOCUMENTS

| 2002/0060330 A1* | 5/2002 | Onishi et al. ............ 257/262 |
| 2003/0224588 A1* | 12/2003 | Yamauchi et al. ......... 438/524 |
| 2005/0191821 A1* | 9/2005 | Beach et al. ............. 438/401 |
| 2006/0067137 A1* | 3/2006 | Udrea et al. .......... 365/189.09 |
| 2009/0057713 A1* | 3/2009 | Hirler .................... 257/143 |

* cited by examiner

*Primary Examiner*—Tu-Tu V Ho
(74) *Attorney, Agent, or Firm*—Farjami & Farjami LLP

(57) ABSTRACT

A power semiconductor device that includes common conduction regions, charge compensation regions, each adjacent a respective common conduction region, and a stand off region over the common conduction regions and charge compensation regions.

20 Claims, 2 Drawing Sheets

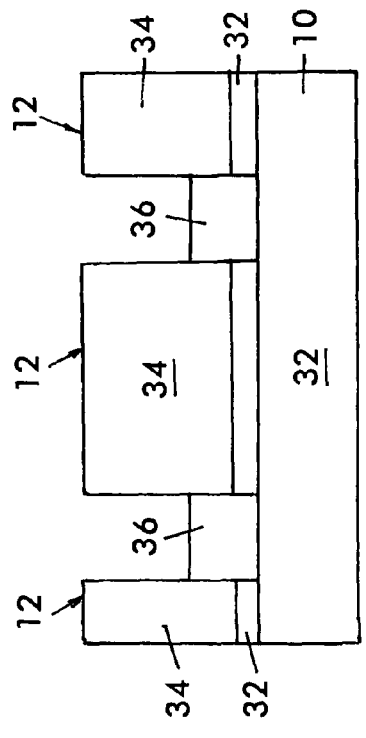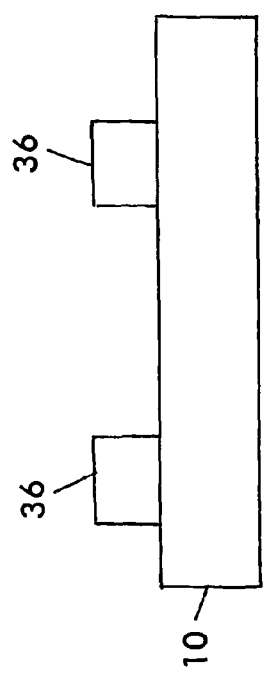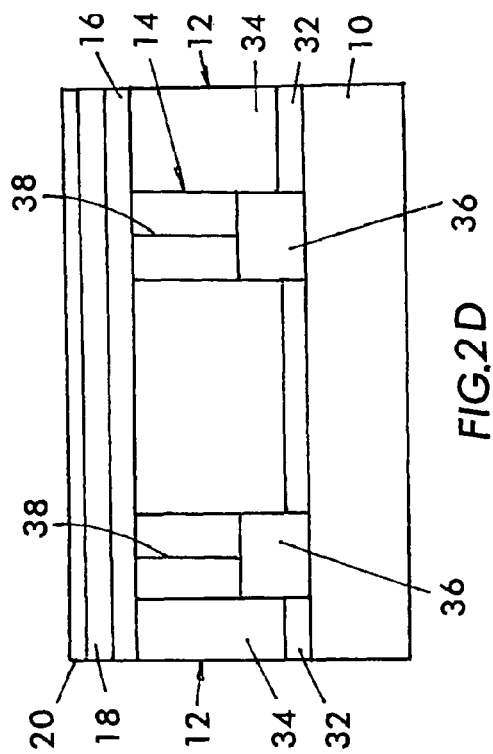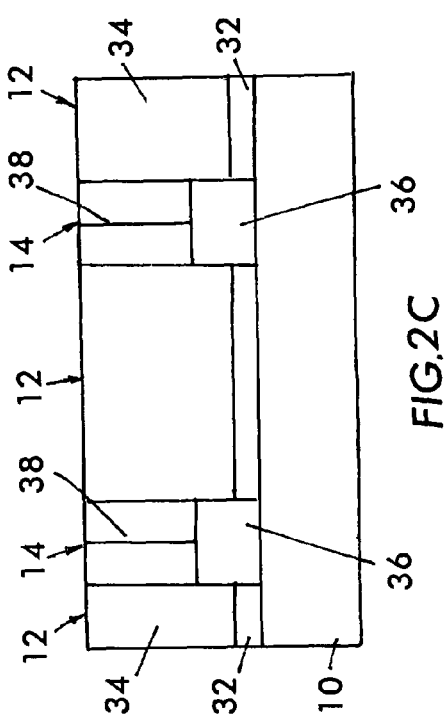

III-NITRIDE POWER SEMICONDUCTOR DEVICE

RELATED APPLICATIONS

The present application is related to U.S. patent application Ser. No. 11/004,189, filed on Dec. 3, 2004, entitled III-NITRIDE DEVICE AND METHOD WITH VARIABLE EPITAXIAL GROWTH DIRECTION, which is based on and claims priority to U.S. Provisional Patent Application No. 60/527,626, filed on Dec. 5, 2003, entitled EPITAXIALLY GROWN VERTICAL BASE BIPOLAR MOS TRANSISTOR, the entire disclosures of which are incorporated herein by reference.

DEFINITION

As referred to herein a III-nitride semiconductor or III-nitride refers to a semiconductor alloy from the InAlGaN system, including, but not limited to, GaN, AlGaN, AlN, InGaN, InAlGaN, and the like.

BACKGROUND AND SUMMARY OF THE INVENTION

The present invention relates to semiconductor devices and more particularly to power semiconductor switching devices.

It is well known that in a conventional power semiconductor switching device there is a trade off between the ON resistance the device and its ability to withstand breakdown under reverse voltage conditions. In a conventional device, the breakdown voltage withstand capability is supported by a PN junction. Thus, designers often have to select a resistivity for the P region (e.g. base region) and a resistivity for the N region (e.g. drift region) to obtain a desired combination of the breakdown voltage and ON resistance.

According to the well known superjunction principles, the drift region of the device, which contributes significantly to the ON resistance of the device, is provided with charge compensation regions to deplete the drift region under reverse voltage. As a result, the drift region can be designed more conductive with less concern for a tradeoff with the breakdown voltage capability. One known method for fabricating a superjunction device is to implant dopants into the drift region to obtain the charge compensation regions. Such a method, however, requires annealing and the like steps after implanting, which is not desirable specially when the device is formed using III-nitride materials.

U.S. patent application Ser. No. 11/004,189, assigned to the assignee of the present application, discloses a device and method for fabricating a superjunction device in which the charge compensation regions are grown epitaxially rather than implanting to form the charge compensation regions.

A device according to the present invention includes charge compensation regions epitaxially formed according to the method disclosed in U.S. patent application Ser. No. 11/004,189, and additional beneficial features.

Specifically, a device according to the present invention includes a substrate, common conduction regions of a first conductivity disposed on the substrate, charge compensation regions of a second conductivity each adjacent a respective common conduction region, a stand off region of the first conductivity over the common conduction regions and the charge compensation regions, a base region of the second conductivity over the stand off region, a source region of the first conductivity over the base region, a gate trench extending through the source region and the base region, a gate insulation body lining the sidewalls of the gate trench, a gate electrode inside the trench, a source electrode ohmically connected to the source region, and a drain electrode ohmically connected to the substrate.

According to one aspect of the present invention, each charge compensation region is disposed over a respective pillar of a growth inhibition material.

According to another aspect of the present invention, the common conduction regions, the charge compensation regions, the stand off region, the base region and the source regions are comprised of a respective III-nitride material.

Other features and advantages of the present invention will become apparent from the following description of the invention which refers to the accompanying drawings.

BRIEF DESCRIPTION OF THE FIGURES

FIGS. 2A-2D illustrate a preferred process for fabricating a device according to the present invention.

DETAILED DESCRIPTION OF THE INVENTION

Figure 1:
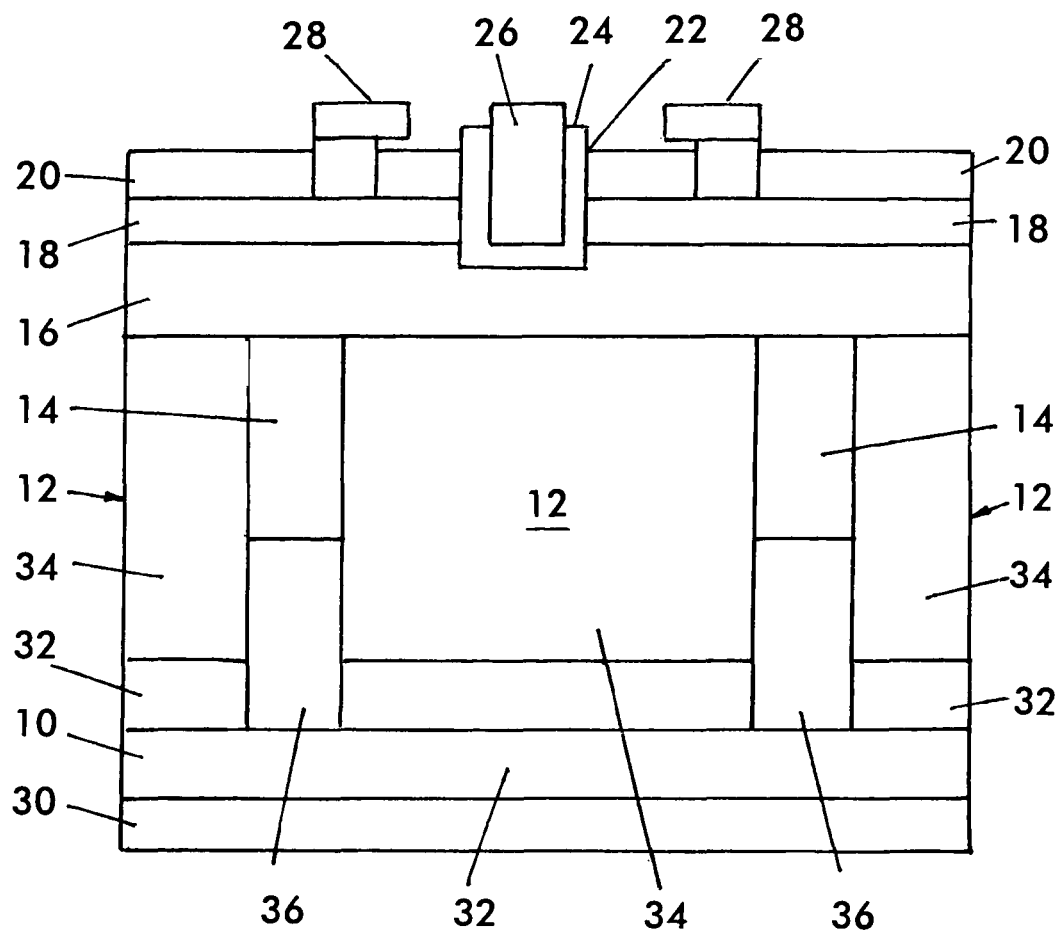
FIG. 1 illustrates a cross-section of a device according to the preferred embodiment of the present invention.

Referring to FIG. 1, a power semiconductor device according to an embodiment of the present invention is a field effect transistor that includes substrate 10, common conduction regions 12 of a first conductivity (e.g., N-type or P-type) disposed on substrate 10, charge compensation regions 14 of a second conductivity opposite to the first conductivity (e.g., P-type or N-type) each adjacent a common conduction region 12, a stand off region 16 of the first conductivity extending over the common conduction regions 12 and charge compensation regions 14, a base region 18 of the second conductivity over stand off region 16, a source region 20 of the first conductivity over base region 18, at least one gate trench 22 extending at least through source region 20 and base region 18, gate insulation body 24 lining at least the sidewalls and preferably the bottom of trench 22, gate electrode 26 contained inside trench 22, source electrodes 28 ohmically coupled to at least source region 20 and preferably ohmically coupled to base region 18 while physically extending through source region 20, and drain electrode 30 ohmically connected to substrate 10.

Note that in the preferred embodiment, each common conduction region 12 includes a highly conductive region 32 (e.g., $N^+$ or $P^+$) formed directly on substrate 10 and a lower conductivity region 34 (e.g., $N^-$ or $P^-$) formed on region 32.

Note further that in a device according to the present invention, each charge compensation region resides over a respective pillar 36 that resides on substrate 10. Preferably, pillars 36 are formed from a material that does not allow semiconductor growth thereon such as silicon dioxide.

Furthermore, according to an aspect of the present invention, common conduction regions 12, charge compensation regions 14, stand off region 16, base region 18, and source region 20 are comprised of a III-nitride material. For example, all regions listed may be comprised of GaN.

Referring now to FIGS. 2A-2D, a device according to the present invention is fabricated by first depositing on a substrate 10 a material body that inhibits the growth of a semiconductor layer, e.g., $SiO_2$. The body is then patterned to obtain a plurality of spaced growth inhibition islands 36 as illustrated in FIG. 2A.

Next, $N^+$ type GaN bodies 32 are grown epitaxially on substrate 10 between islands 36, followed by epitaxial growth of N-type GaN bodies 34 over bodies 32. Note that bodies 32 preferably do not rise above islands 36, but that bodies 34 rise above islands 36. Together, each body 32 and body 34 grown thereon constitute a common conduction region 12 in the preferred embodiment. FIG. 2B illustrates the resulting structure.

Thereafter, P-type GaN is grown laterally on the sidewalls of body 34 to form charge compensation regions 14. Note that charge compensation regions 14 may be doped to be in charge balance (or near charge balance) with bodies 34 of common conduction regions 12 according to the superjunction design principles. Note further that because regions 14 are formed as a result of growth on sidewalls of opposing bodies 34, each region 14 includes two epitaxially grown bodies meeting at a defect region 38. The resulting structure is illustrated by FIG. 2C.

According to one aspect of the present invention, the height growth inhibition bodies 36 can be used to vary the height of charge compensation regions 14 relative to common conduction regions 12, thereby allowing the designer flexibility in selecting the proper total charge content for the two regions. The height of charge compensation regions 14 can be used to determine the breakdown voltage of the device.

Next, N-type GaN is grown epitaxially to form stand off region 16 that extends over common conduction regions 12 and charge compensation regions 14. The stand off region 16 serves to spread the current. P-type GaN is then grown over stand off region 16 to constitute base region 18, and $N^+$ type GaN is grown over base region 18 to constitute source region. The resulting structure is illustrated by FIG. 2D.

Next, trench 22 is formed, lined with gate dielectric 24, and filled with conductive material to form gate electrode 26. Thereafter, source electrodes 28 and drain electrode 30 are formed to obtain a device according to the preferred embodiment as illustrated by FIG. 1.

Note that in a device according to the preferred embodiment, substrate 10 may be comprised of materials such as SiC, GaN, or N+ZnO.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
a common conduction region of a first conductivity disposed over a substrate;
a charge compensation region of a second conductivity adjacent said common conduction region, said charge compensation region disposed over a pillar of a growth inhibition material;
a stand off region of said first conductivity over said common conduction region and said charge compensation region;
a base region of said second conductivity over said stand off region;
a source region of said first conductivity over said base region.

2. The power semiconductor device of claim 1, comprising another charge compensation region adjacent said common conduction region wherein said another charge compensation region is disposed over a respective pillar of a growth inhibition material.

3. The power semiconductor device of claim 1, wherein said growth inhibition material is comprised of silicon dioxide.

4. The power semiconductor device of claim 1, wherein said first conductivity is N-type and said second conductivity is P-type.

5. The power semiconductor device of claim 1, wherein said first conductivity is P-type and said second conductivity is N-type.

6. The power semiconductor device of claim 1, wherein said charge compensation region is an epitaxial body.

7. The power semiconductor device of claim 1, wherein said common conduction region, said charge compensation region, said stand off region, said base region and said source region are each comprised of a respective III-nitride material.

8. The power semiconductor device of claim 1, wherein said III-nitride material is comprised of GaN.

9. The power semiconductor device of claim 1, further comprising a gate trench extending through said source region and said base region, a gate insulation body lining the sidewalls of said gate trench, a gate electrode inside said trench, a source electrode ohmically connected to said source region, and a drain electrode ohmically connected to said substrate.

10. A superjunction semiconductor device comprising:
a common conduction region of a first conductivity disposed over a substrate;
a charge compensation region of a second conductivity adjacent said common conduction region, said common conduction region comprising a first conductive region and a second conductive region formed on said first conductive region, the first and second conductive regions having different doping profiles; and
a pillar of a growth inhibition material disposed under said charge compensation region, said second conductive region rising from below a surface of said pillar to above said surface of said pillar.

11. The superjunction semiconductor device of claim 10, wherein said first conductive region of has a higher conductivity than said second conductive region.

12. The superjunction semiconductor device of claim 10, wherein said common conduction region, said charge compensation region, and a stand off region comprise a respective III-nitride material.

13. The superjunction semiconductor device of claim 10, further comprising:
a stand off region of said first conductivity over said common conduction region and said charge compensation region;
a base region of said second conductivity over said stand off region;
a source region of said first conductivity over said base region.

14. The superjunction semiconductor device of claim 10, further comprising a gate trench disposed in a stand off region.

15. A superjunction semiconductor device comprising:
a common conduction region of a first conductivity disposed over a substrate;
a charge compensation region of a second conductivity adjacent said common conduction region, said common conduction region comprising a first conductive region and a second conductive region formed on said first conductive region, the first and second conductive regions having different doping profiles; and
a pillar of a growth inhibition material disposed under said charge compensation region, said pillar rising above said first conductive region.

16. The superjunction semiconductor device of claim 15, wherein said charge compensation region comprises laterally grown semiconductor material.

17. The superjunction semiconductor device of claim 15, wherein said charge compensation region comprises at least two epitaxially grown bodies meeting at a defect region.

18. The superjunction semiconductor device of claim 15, wherein said common conduction region, said charge compensation region, and a stand off region comprise a respective III-nitride material.

19. The superjunction semiconductor device of claim 15, wherein said first conductive region has a higher conductivity than said second conductive region.

20. The superjunction semiconductor device of claim 15, further comprising:
   a stand off region of said first conductivity over said common conduction region and said charge compensation region;
   a base region of said second conductivity over said stand off region;
   a source region of said first conductivity over said base region.

* * * * *